(12) United States Patent
Lin et al.

(10) Patent No.: US 9,203,385 B2
(45) Date of Patent: Dec. 1, 2015

(54) SIGNAL COMPONENT REJECTION

(71) Applicant: QUALCOMM, Incorporated, San Diego, CA (US)

(72) Inventors: Saihua Lin, Santa Clara, CA (US); Roger Brockenbrough, Los Gatos, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 13/725,315

(22) Filed: Dec. 21, 2012

(65) Prior Publication Data
US 2014/0176217 A1 Jun. 26, 2014

(51) Int. Cl.
| H04B 1/04 | (2006.01) |
| H01Q 11/12 | (2006.01) |
| H03K 5/1252 | (2006.01) |
| H03K 5/13 | (2014.01) |
| H03D 7/16 | (2006.01) |
| H03D 7/18 | (2006.01) |

(52) U.S. Cl.
CPC .............. *H03K 5/1252* (2013.01); *H03D 7/165* (2013.01); *H03D 7/18* (2013.01); *H03K 5/13* (2013.01); *H03D 2200/0086* (2013.01)

(58) Field of Classification Search
CPC .... H03C 2200/0045; H03K 7/08; H04B 1/28; H03D 7/1441
USPC ..................... 455/114.1–114.2, 318, 323, 118
See application file for complete search history.

(56) References Cited

U.S. PATENT DOCUMENTS

| 3,649,922 A | 3/1972 | Ralph et al. |
| 3,839,716 A | 10/1974 | Reichnebacher |
| 4,458,216 A | 7/1984 | Bingham |
| 4,713,622 A | 12/1987 | Wanchoo et al. |
| 4,894,621 A | 1/1990 | Koenig et al. |
| 7,224,219 B2 | 5/2007 | Spencer |
| 7,738,851 B2 | 6/2010 | Cooley et al. |
| 7,986,192 B2 | 7/2011 | Lee et al. |
| 2004/0212417 A1 | 10/2004 | Behzad |

(Continued)

FOREIGN PATENT DOCUMENTS

| CN | 101136647 A | 3/2008 |
| EP | 2360835 A1 | 8/2011 |

(Continued)

OTHER PUBLICATIONS

Moseley, et al., "Experimental Verification of a Harmonic-Rejection Mixing Concept using Blind Interference Canceling," European Conference on Wireless Technofory (EuwiT), Oct. 2008, pp. 210-213, Amsterdam, The Netherlands.

(Continued)

*Primary Examiner* — Nguyen Vo
(74) *Attorney, Agent, or Firm* — Peter A. Clevenger

(57) ABSTRACT

A method includes providing a first local oscillator signal having a first duty cycle to a first mixer unit and providing a second local oscillator signal having a second duty cycle to a second mixer unit. At least one of the first duty cycle or the second duty cycle is greater than fifty percent. A frequency of the first local oscillator signal approximately equals a frequency of the second local oscillator signal. The method may also include generating a modulated output signal based on an output signal of the first mixer unit and based on an output signal of the second mixer unit.

22 Claims, 5 Drawing Sheets

(56) References Cited

U.S. PATENT DOCUMENTS

| | | |
|---|---|---|
| 2009/0202022 A1 | 8/2009 | Kaczman et al. |
| 2009/0225741 A1 | 9/2009 | Wang et al. |
| 2009/0325510 A1 | 12/2009 | Pullela et al. |
| 2010/0119022 A1 | 5/2010 | He et al. |
| 2010/0120377 A1 | 5/2010 | He |
| 2011/0051838 A1 | 3/2011 | Asuri et al. |
| 2011/0102051 A1 | 5/2011 | Zeller |
| 2011/0298521 A1 | 12/2011 | Ru et al. |
| 2012/0313672 A1* | 12/2012 | Andersson et al. ........... 327/116 |
| 2015/0094004 A1 | 4/2015 | Vora et al. |

FOREIGN PATENT DOCUMENTS

| | | |
|---|---|---|
| GB | 1341969 A | 12/1973 |
| GB | 2247792 A | 3/1992 |
| JP | S5863256 A | 4/1983 |
| JP | 2000183764 A | 6/2000 |
| JP | 2005341240 A | 12/2005 |
| JP | 2006519507 A | 8/2006 |
| WO | 2004017547 A2 | 2/2004 |
| WO | 2008135954 A2 | 11/2008 |
| WO | 2008139390 A1 | 11/2008 |
| WO | 2009014535 A1 | 1/2009 |
| WO | WO-2011101305 A1 | 8/2011 |

OTHER PUBLICATIONS

Weldon, J. et al. (Dec. 2001) A 1.75-GHz Highly Integrated Narrow-Band CMOS Transmitter With Harmonic- Rejection Mixers, IEEE, vol. 36, No. 12, pp. 2003-2015. cited by other.
Weldon J.A., at al., A 1.75GHz Highly Integrated Narrow-Band CMOS Transmitter with Harmonic-Rejection Mixers, ISSCC 2001 IEEE International Solid-State Circuits Conference.
International Search Report and Written Opinion—PCT/US2013/077094—ISA/EPO—Apr. 23, 2014.
Klumperink Eric A.M., et al., "Cognitive radios for dynamic spectrum access polyphase multipath radio circuits for dynamic spectrum access", IEEE Communications Magazine, IEEE Service Center, Piscataway, US, vol. 44, No. 5, May 1, 2007, pp. 104-112, XP011181064, ISSN: 0163-6804 p. 109, col. 1, line 16-col. 2, line 19; figure 4.
Moseley N A et al., "A Two-Stage Approach to Harmonic Rejection Mixing Using Blind Interference Cancellation", IEEE Transactions on Circuits and Systems II: Express Briefs, IEEE, US, vol. 55, No. 10, Oct. 1, 2008, pp. 966-970, XP011236580, ISSN: 1549-7747, DOI: 10.1109/TCSII.2008.926796.

* cited by examiner

SIGNAL COMPONENT REJECTION

I. FIELD

The present disclosure is generally related to signal component rejection.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

A computing device may include a signal transmitter including a mixer circuit. The mixer circuit may be used to generate an output signal that is provided to a power amplifier of the signal transmitter. The mixer circuit may generate the output signal based on harmonic components of an input signal and harmonic components of a local oscillator signal. The output signal generated by the mixer may have signal components at various frequencies that are based on the harmonic frequencies of the local oscillator signal. Some of the signal components of the output signal may intermodulate with each other to cause unwanted in-band distortion. Such intermodulation between the signal components of the output signal may degrade the adjacent channel leakage-power ratio (ACLR) and the error vector magnitude (EVM) of the signal transmitter of the computing device. For example, the degraded ACLR and EVM caused by such in-band distortion may result in a drop in signal quality and performance at a wireless device (e.g., cause a signal-to-noise ratio (SNR) to drop below an acceptable level).

Previous attempts at reducing in-band distortion typically involve using a harmonic rejection mixer. However, such systems may only reject a specific harmonic (e.g., a third order harmonic) and may not be flexible enough to cancel multiple desired higher-order harmonics. Moreover, such systems may involve generating various high-frequency signals (e.g., at frequencies three times, five times, etc. higher than a local oscillator (LO) frequency), generating signals with varying delays, and/or using mixers of different sizes. Thus, existing systems and methods of reducing in-band distortion may add complexity, cost, and/or power consumption to a device. There remains a need for a system and method to address in-band distortion in a less complex, less expensive, and less power-consuming manner.

III. SUMMARY

A number of mixer units may be used to generate a modulated output signal. Each mixer unit may receive a corresponding scaled signal and a corresponding local oscillator signal and generate a mixer output signal. To illustrate, an input signal may be provided to multiple scaling units (e.g., amplifiers). Each scaling unit may scale the input signal by a corresponding gain factor to generate a corresponding scaled signal that is provided to a corresponding mixer unit. Each mixer unit may also receive a corresponding local oscillator signal that has a particular duty cycle that is different from duty cycles of other local oscillator signals provided to other mixer units. All local oscillator signals may have substantially the same frequency. The mixer output signals, generated based on the scaled signals and the local oscillator signals, may be combined with each other to generate the modulated output signal. The modulated output signal may have substantially suppressed and/or rejected signal components corresponding to particular harmonic frequencies of the local oscillator signals based on the gain factors of the scaling units and the duty cycles of the local oscillator signals. As used herein, "suppression" and "rejection" of a signal component (e.g., a particular harmonic component) may be interchangeable and may refer to a signal processing operation by which a signal component that is present in an input signal is entirely or substantially removed with respect to an output signal. For example, a first mixer unit may have a 1/N duty cycle and a second mixer unit may have a 2/N duty cycle, where N−1 is a number of mixer units that have outputs that may be combined to generate the modulated output signal.

In a particular embodiment, a method includes providing a first local oscillator signal having a first duty cycle to a first mixer unit. The method may also include providing a second local oscillator signal having a second duty cycle to a second mixer unit. At least one of the first duty cycle or the second duty cycle is greater than fifty percent. A frequency of the first local oscillator signal approximately equals a frequency of the second local oscillator signal. The method may also include generating a modulated output signal based on an output signal of the first mixer unit and based on an output signal of the second mixer unit.

In another particular embodiment, a device includes a first mixer unit, a second mixer unit, and a third mixer unit. The first mixer unit may be configured to receive a first local oscillator signal having a first duty cycle. The second mixer unit may be configured to receive a second local oscillator signal having a second duty cycle. The third mixer unit may be configured to receive a third local oscillator signal having a third duty cycle. A modulated output signal may be generated based on an output signal of the first mixer unit, an output signal of the second mixer unit, and an output signal of the third mixer unit.

In another particular embodiment, an apparatus includes first means for signal mixing, second means for signal mixing, and third means for signal mixing. The first means for signal mixing may be configured to receive a first local oscillator signal having a first duty cycle. The second means for signal mixing may be configured to receive a second local oscillator signal having a second duty cycle. The third means for signal mixing may be configured to receive a third local oscillator signal having a third duty cycle. A modulated output signal may be generated based on an output signal of the first means for signal mixing, an output signal of the second means for signal mixing, and an output signal of the third means for signal mixing.

One particular advantage provided by at least one of the disclosed embodiments is suppression and/or rejection of signal components of an output signal. The output signal may be provided to a non-linear amplifier (e.g., a non-linear power amplifier). By suppressing and/or rejecting signal components of the output signal, intermodulation between signal components of the output signal may be reduced. For example, a third order intermodulation may be reduced.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
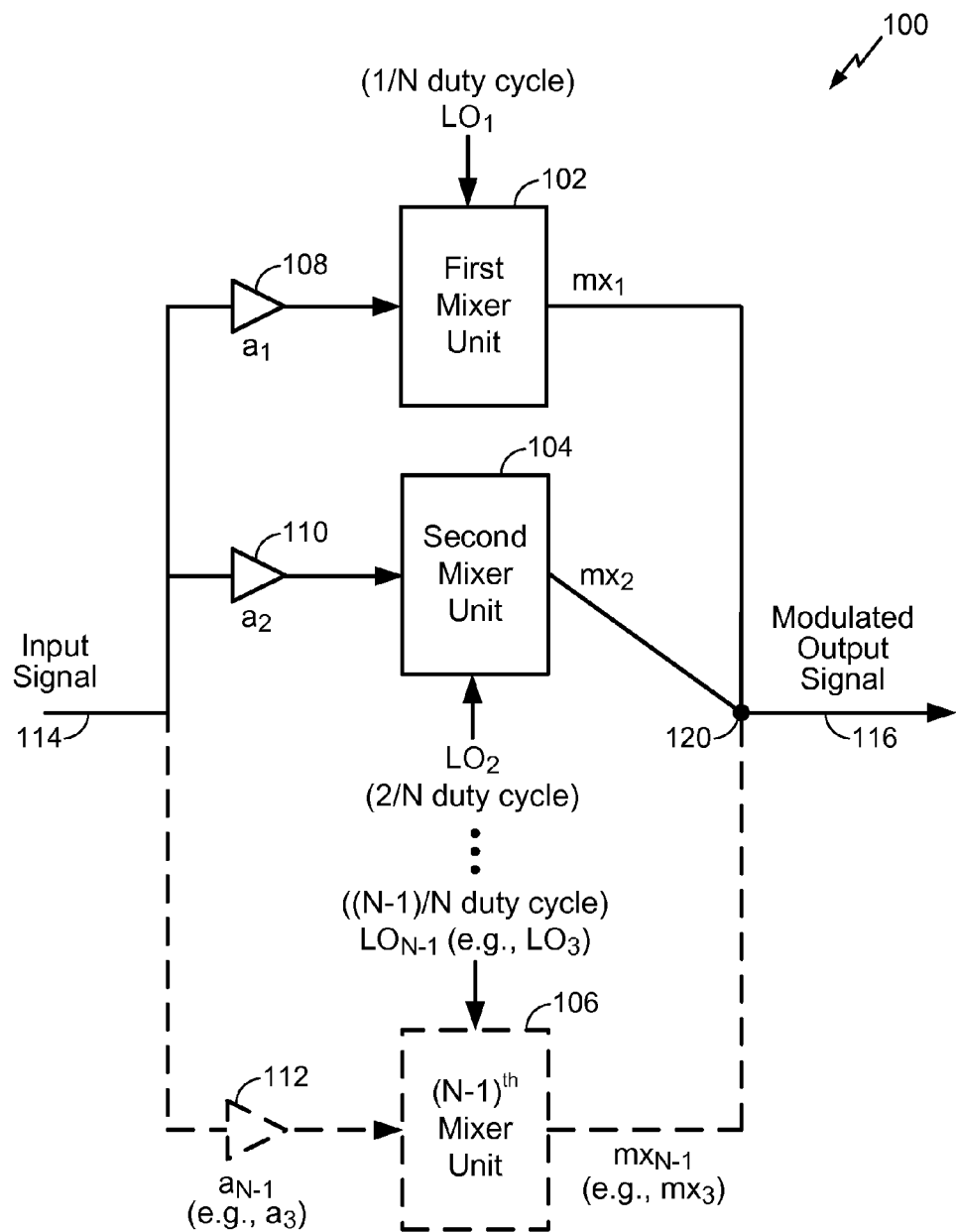
FIG. 1 is a block diagram of a particular embodiment of a device operable to perform signal component rejection.

Referring to FIG. 1, a particular embodiment of a device operable to perform signal component rejection is depicted and generally designated 100. As used herein, "suppression" and "rejection" of a signal component (e.g., a particular harmonic component) may be interchangeable and may refer to a signal processing operation by which a signal component that is present in an input signal is entirely or substantially removed with respect to an output signal. The device 100 includes N−1 mixer units and N−1 scaling units, where N is an integer greater than 2. To illustrate, when N is 3, the device 100 has two mixer units including a first mixer unit 102 and a second mixer unit 104. When N is greater than 3, the device 100 may have three or more mixer units. For example, when N is 4, the device 100 includes the first mixer unit 102, the second mixer unit, 104, and the third (i.e., $(N-1)^{th}$) mixer unit 106. As another example, when N is 5, the device 100 has four mixer units including the first mixer unit 102, the second mixer unit 104, a third mixer unit (not shown), and the fourth (i.e., $(N-1)^{th}$) mixer unit 106. Similarly, when N is 3, the device 100 may have two scaling units including a first scaling unit 108 and a second scaling unit 110. When N is greater than 3, the device 100 may have three or more scaling units including the first scaling unit 108, the second scaling unit 110, and an $(N-1)^{th}$ scaling unit 112. For example, when N is 4, the device 100 includes the first scaling unit 108, the second scaling unit, 110, and the third (i.e., N−1) scaling unit 112. As another example, when N is 5, the device 100 has four scaling units including the first scaling unit 108, the second scaling unit, 110, a third scaling unit (not shown), and the fourth (i.e., N−1) scaling unit 112.

In a particular embodiment, an input signal on input line 114 may be provided to each scaling unit including the first scaling unit 108, the second scaling unit 110, and the $(N-1)^{th}$ scaling unit 112. For example, the input signal may be a baseband signal.

In a particular embodiment, the first scaling unit 108 may be coupled to the first mixer unit 102. The second scaling unit 110 may be coupled to the second mixer unit 104. The $(N-1)^{th}$ scaling unit 112 may be coupled to the $(N-1)^{th}$ mixer unit 106. A first mixer output signal ($mx_1$) from the first mixer unit 102, a second mixer output signal ($mx_2$) from the second mixer unit 104, and an $(N-1)^{th}$ mixer output signal ($mx_{N-1}$) from the $(N-1)^{th}$ mixer unit 106 may be combined at a node 120 to generate a modulated output signal on an output line 116. For example, the modulated output signal on the output line 116 may be a radiofrequency (RF) signal.

In a particular embodiment, the first scaling unit 108 may be configured to receive the input signal and to generate a first scaled signal. The first scaling unit 108 may generate the first scaled signal by scaling the input signal by a first gain factor ($a_1$). For example, the first scaling unit 108 may be an amplifier. The first scaling unit 108 may provide the first scaled signal to the first mixer unit 102.

In a particular embodiment, the second scaling unit 110 may be configured to receive the input signal and to generate a second scaled signal. The second scaling unit 110 may generate the second scaled signal by scaling the input signal by a second gain factor ($a_2$). For example, the second scaling unit 110 may be an amplifier. The second scaling unit 110 may provide the second scaled signal to the second mixer unit 104.

In a particular embodiment, the $(N-1)^{th}$ scaling unit 112 may be configured to receive the input signal and to generate an $(N-1)^{th}$ scaled signal. The $(N-1)^{th}$ scaling unit 112 may generate the $(N-1)^{th}$ scaled signal by scaling the input signal by an $(N-1)^{th}$ gain factor ($a_{N-1}$). The $(N-1)^{th}$ scaling unit 112 may provide the $(N-1)^{th}$ scaled signal to the $(N-1)^{th}$ mixer unit 106.

In a particular embodiment, the first mixer unit 102 may be configured to receive the first scaled signal from the first scaling unit 108. The first mixer unit 102 may also be configured to receive a first local oscillator signal ($LO_1$) that has a first duty cycle. The first mixer unit 102 may be configured to generate a first mixer output signal ($mx_1$) based on the first scaled signal and the first local oscillator signal ($LO_1$).

In a particular embodiment, the second mixer unit 104 may be configured to receive the second scaled signal from the second scaling unit 110. The second mixer unit 104 may also be configured to receive a second local oscillator signal ($LO_2$) that has a second duty cycle. The frequency of the second local oscillator signal ($LO_2$) may approximately equal the frequency of the first local oscillator signal ($LO_1$). As used herein, two quantities may be "approximately" or "substantially" equal or the same if the two quantities are within an acceptable signal processing margin of error or tolerance (e.g., 0.1%, 1%, 5%, 10%, etc.). A signal component that is "substantially" suppressed or rejected may be absent, with respect to an output signal, within an acceptable signal processing margin of error or tolerance. The second mixer unit 104 may be configured to generate a second mixer output signal ($mx_2$) based on the second scaled signal and the second local oscillator signal ($LO_2$).

In a particular embodiment, the $(N-1)^{th}$ mixer unit 106 may be configured to receive the $(N-1)^{th}$ scaled signal from the $(N-1)^{th}$ scaling unit 112. The $(N-1)^{th}$ mixer unit 106 may also be configured to receive an $(N-1)^{th}$ local oscillator signal ($LO_{N-1}$) that has an $(N-1)^{th}$ duty cycle. The $(N-1)^{th}$ local oscillator signal ($LO_{N-1}$) may have substantially the same frequency as the first local oscillator signal ($LO_1$) and the second local oscillator signal ($LO_2$). The $(N-1)^{th}$ mixer unit 106 may be configured to generate an $(N-1)^{th}$ mixer output signal ($mx_{N-1}$) based on the $(N-1)^{th}$ scaled signal and the $(N-1)^{th}$ local oscillator signal ($LO_{N-1}$). For example, if N is 4, the $(N-1)^{th}$ local oscillator signal is a third local oscillator signal ($LO_3$).

In a particular embodiment, each of the input signal on the input line 114, the first local oscillator signal ($LO_1$), the second local oscillator signal ($LO_2$), the $(N-1)^{th}$ local oscillator signal ($LO_{N-1}$), the first mixer output signal ($mx_1$), the second mixer output signal ($mx_2$), and the $(N-1)^{th}$ mixer output signal ($mx_{N-1}$) includes a differential in-phase component and a differential quadrature component. For example, each of the first mixer unit 102, the second mixer unit 104, and the (N−1)$^{th}$ mixer unit 106 may include a first mixer circuit to receive a corresponding differential in-phase scaled signal generated based on a differential in-phase component of the input signal on the input line 114 and a second mixer circuit to receive a corresponding differential quadrature-phase scaled signal generated based on a differential quadrature-phase component of the input signal on the input line 114. The first mixer circuit of each of the mixer units 102, 104, 106 may also receive a corresponding differential in-phase local oscillator signal. Similarly, the second mixer circuit of each of the mixer units 102, 104, 106 may receive a corresponding differential quadrature-phase local oscillator signal.

In a particular embodiment, at least one of the first duty cycle, the second duty cycle, and the (N−1)$^{th}$ duty cycle is greater than 50 percent (i.e., greater than ½). To illustrate, the first local oscillator signal (LO$_1$) may be a pulse wave signal that has the first duty cycle. For example, the first duty cycle may be approximately 1/N, where N is an integer greater than 2, where the device 100 includes N−1 mixer units that each have an output coupled to the node 120, and where 1/N duty cycle is the same as (1×100)/N percent duty cycle. Similarly, the second local oscillator signal (LO$_2$) may be a pulse wave signal that has the second duty cycle. The second duty cycle may be approximately 2/N, where 2/N duty cycle is the same as a (2×100)/N percent duty cycle. The (N−1)$^{th}$ local oscillator signal (LO$_{N-1}$) may also be a pulse wave signal that has the (N−1)$^{th}$ duty cycle. The (N−1)$^{th}$ duty cycle may be approximately (N−1)/N, where (N−1)/N duty cycle is the same as a ((N−1)×100)/N percent duty cycle. For example, if the device 100 includes three or more mixer units (i.e., N is greater than 3), a third local oscillator signal may have a third duty cycle that is approximately 3/N. To illustrate, if N is 4, the first duty cycle may be approximately ¼, the second duty cycle may be approximately 2/4, and the third (i.e., N−1) duty cycle may be approximately ¾.

In a particular embodiment, the first mixer output signal (mx$_1$), the second mixer output signal (mx$_2$), and the (N−1)$^{th}$ mixer output signal (mx$_{N-1}$) may be combined at the node 120 to generate the modulated output signal on the output line 116. The combination of the first mixer output signal (mx$_1$), the second mixer output signal (mx$_2$), and the (N−1)$^{th}$ mixer output signal (mx$_{N-1}$) may result in the modulated output signal having substantially suppressed (i.e., substantially rejected) signal components corresponding to particular harmonic signal components of the local oscillator signals LO$_1$, LO$_2$, . . . , LO$_{N-1}$.

To illustrate, a local oscillator signal may be represented by Equation (1).

$$s_d(t) = Ad + 2A/\pi [\sin(\pi d)\cos(\omega t) + \tfrac{1}{2} \sin(2\pi d)\cos(2\omega t) + \tfrac{1}{3} \sin(3\pi d)\cos(3\omega t) + \tfrac{1}{4} \sin(4\pi d)\cos(4\omega t) + \tfrac{1}{5} \sin(5\pi d)\cos(5\omega t) + \ldots ]$$  Equation (1)

In Equation (1), $s_d(t)$ may represent each one of the first local oscillator signal (LO$_1$), the second local oscillator signal (LO$_2$), and the (N−1)$^{th}$ local oscillator signal (LO$_{N-1}$). 'A' is the amplitude of the particular local oscillator signal provided to a mixer unit, and 'd' is a duty cycle of the local oscillator signal. For example, the first mixer output signal (mx$_1$) having 1/N duty cycle is represented by Equation (2).

$$s_{1/N}(t) = A/N + 2A/\pi [\sin(\pi/N)\cos(\omega t) + \tfrac{1}{2} \sin(2\pi/N)\cos(2\omega t) + \tfrac{1}{3} \sin(3\pi/N)\cos(3\omega t) + \tfrac{1}{4} \sin(4\pi/N)\cos(4\omega t) + \tfrac{1}{5} \sin(5\pi/N)\cos(5\omega t) + \ldots ]$$  Equation (2)

Equation (3) represents the first mixer output signal (mx$_1$) having 1/N duty cycle, where N is 3 and where the number of mixer units is 2 (i.e., N−1).

$$s_{1/3}(t) = A/3 + 2A/\pi [\sin(\pi/3)\cos(\omega t) + \tfrac{1}{2} \sin(2\pi/3)\cos(2\omega t) + \tfrac{1}{3} \sin(3\pi/3)\cos(3\omega t) + \tfrac{1}{4} \sin(4\pi/3)\cos(4\omega t) + \tfrac{1}{5} \sin(5\pi/3)\cos(5\omega t) + \ldots ]$$  Equation (3)

Equation (4) and Equation (5) represent the modulated output signal on the output line 116 generated by combining the first mixer output signal (mx$_1$), the second mixer output signal (mx$_2$), and the (N−1)$^{th}$ mixer output signal (mx$_{N-1}$) at the node 120.

$$y(t) = a_1 i(t) s_{1/N}(t) + a_2 i(t) s_{2/N}(t) + \ldots + a_{N-1} i(t) s_{(N-1)/N}(t)$$  Equation (4)

$$y(t) = Am/N[a_1 + 2a_2 + (N-1)a_{N-1}]i(t) + i(t)[(2A)/\pi] \\ [\cos(\omega t) - (1/(2N-1))\cos((2N-1)\omega t) + (1/(2N+1))\cos((2N+1)\omega t) + \ldots ]$$  Equation (5)

In Equation (4) and Equation (5), y(t) represents the modulated output signal on the output line 116, i(t) represents the input signal on the input line 114, $s_{1/N}(t)$ represents the mixer output signal (mx$_1$), $s_{2/N}(t)$ represents the second mixer output signal (mx$_2$), and $s_{(N-1)/N}(t)$ represents the (N−1)$^{th}$ mixer output signal (mx$_{N-1}$). $a_1$, $a_2$, and $a_{N-1}$ may be the first scaling factor ($a_1$) of the first scaling unit 108, the second scaling factor ($a_2$) of the second scaling unit 110, and the (N−1)$^{th}$ scaling factor ($a_{N-1}$) of the (N−1)$^{th}$ scaling unit 112, respectively. 'm' is a factor calculated based on $a_1$, $a_2$, and $a_{N-1}$.

As the right side of Equation (5) illustrates, the modulated output signal represented by y(t) includes signal components corresponding to the first (fundamental) harmonic signal component (cos(ωt)) of the local oscillator signals, to the (2N−1)$^{th}$ harmonic signal component (cos((2N−1)ωt)) of the local oscillator signals, and to harmonic signal components of the local oscillator signals that are above the (2N−1)$^{th}$ harmonic signal component of the local oscillator signals. Harmonic signal components of the local oscillator signals corresponding to harmonic frequencies higher than the first harmonic frequency of the local oscillator signals and lower than the (2N−1)$^{th}$ harmonic frequency of the local oscillator signals are suppressed and do not contribute to the modulated output signal, y(t). The modulated output signal represented by y(t) does not include signal components corresponding to harmonic signal components of the local oscillator signals that are above the first harmonic signal component (cos(ωt)) of the local oscillator signals and below the (2N−1)$^{th}$ harmonic signal component (cos((2N−1)ωt)) of the local oscillator signals. Accordingly, signal components of the modulated output signal corresponding to harmonic signal components of the local oscillator signals that are above the first harmonic signal component (cos(ωt)) and below the (2N−1)$^{th}$ harmonic signal component (cos((2N−1)ωt)) are substantially suppressed.

For example, signal components of the modulated output signal corresponding to harmonic signal components of the first local oscillator signal that are above the first harmonic signal component of the first local oscillator signal and below the (2N−1)$^{th}$ harmonic signal component of the first local oscillator signal are substantially suppressed. Similarly, signal components of the modulated output signal corresponding to harmonic signal components of the second local oscillator signal that are above the first harmonic signal component of the second local oscillator signal and below the (2N−1)$^{th}$ harmonic signal component of the second local oscillator signal are substantially suppressed. To illustrate, when the device 100 has two mixer circuits (i.e., N=3), signal components of the modulated output signal corresponding to the second, third, fourth, and fifth harmonic signal components of each of the first local oscillator signal and the second local oscillator signal are substantially suppressed. As another example, when the device 100 has three mixer circuits (i.e., N is 4), signal components of the modulated output signal corresponding to the second, third, fourth, fifth, sixth, and seventh harmonic signal components of each local oscillator signal are substantially suppressed.

In a particular embodiment, the first gain factor, the second gain factor, and the $(N-1)^{th}$ gain factor are selected such that one or more signal components of the modulated output signal are substantially suppressed. To illustrate, the first gain factor, the second gain factor, and the $(N-1)^{th}$ gain factor may be selected such that signal components of the modulated output signal corresponding to particular harmonic frequencies of the first local oscillator signal, corresponding to particular harmonic frequencies of the second local oscillator signal, and corresponding to particular harmonic frequencies of the $(N-1)^{th}$ local oscillator signal are substantially suppressed. Examples of gain factors are illustrated below. The particular harmonic frequencies of each of the first local oscillator signal, the second local oscillator signal, and the $(N-1)^{th}$ local oscillator signal may be harmonic frequencies of the particular local oscillator signal that are higher than the fundamental harmonic frequency of the first local oscillator signal and lower than the $(2N-1)^{th}$ harmonic frequency of the first local oscillator signal. The second set of harmonic frequencies of the second local oscillator signal includes harmonic frequencies of the second local oscillator signal that are higher than the fundamental harmonic frequency of the second local oscillator signal and lower than the $(2N-1)^{th}$ harmonic frequency of the second local oscillator signal, where N is an integer greater than 2, and where N−1 is a number of mixer units configured to generate output signals that are combined to generate the modulated output signal.

Equation (6) provides a generalized representation of the gain factors for each scaling unit based on N. As indicated, N is an integer greater than 2, where the device 100 includes N−1 mixer units that each have an output coupled to the node 120.

$$\frac{\sin \pi/N : \sin 2\pi/N : \sin 3\pi/N : \sin 4\pi/N : \ldots : \sin(N-1)}{\pi/N} \quad \text{Equation (6)}$$

For example, when N is 3, the normalized gain factors corresponding to the first gain factor ($a_1$) of the first scaling unit 108 and the second gain factor ($a_2$) of the second scaling unit 110 are 1 and 1, respectively. The gain factors are normalized based on the first gain term, $\sin \pi/N$, in Equation (6).

As another example, when N is 4, the normalized gain factors corresponding to the first gain factor ($a_1$) of the first scaling unit 108, to the second gain factor ($a_2$) of the second scaling unit 110, and to the third (i.e., N−1) gain factor $a_{N-1}$ are 1, square root of 2, and 1, respectively.

During operation, the input signal on the input line 114 may be provided to the first scaling unit 108, to the second scaling unit 110, and to the $(N-1)^{th}$ scaling unit 112. The first scaling unit 108 may scale the input signal by the first gain factor ($a_1$) and generate the first scaled signal. The first scaling unit 108 may provide the first scaled signal to the first mixer unit 102. The second scaling unit 110 may scale the input signal by the second gain factor ($a_2$) and generate the second scaled signal. The second scaling unit 110 may provide the second scaled signal to the second mixer unit 104. The $(N-1)^{th}$ scaling unit 112 may scale the input signal by the $(N-1)^{th}$ gain factor ($a_{N-1}$) and generate the $(N-1)^{th}$ scaled signal. The $(N-1)^{th}$ scaling unit 112 may provide the $(N-1)^{th}$ scaled signal to the $(N-1)^{th}$ mixer unit 106. For example, if N is 4 (i.e., the device 100 includes 3 mixer units), the $(N-1)^{th}$ scaling unit 112 is a third scaling unit, the $(N-1)^{th}$ gain factor ($a_{N-1}$) is a third gain factor ($a_3$), and the $(N-1)^{th}$ mixer unit 106 is a third mixer unit. Accordingly, the third scaling unit 112 may scale the input signal by the third gain factor ($a_3$) and generate the third scaled signal. The third scaling unit 112 may provide the third scaled signal to the third (i.e., $(N-1)^{th}$) mixer unit 106 that may generate a third mixer output signal ($mx_3$).

The first mixer unit 102 may receive the first scaled signal from the first scaling unit 108 and receive the first local oscillator signal ($LO_1$) having approximately 1/N duty cycle. The first mixer unit 102 may generate the first mixer output signal ($mx_1$) based on the first scaled signal and the first local oscillator signal ($LO_1$). The second mixer unit 104 may receive the second scaled signal from the second scaling unit 110 and receive the second local oscillator signal ($LO_2$) having approximately 2/N duty cycle. The second mixer unit 104 may generate the second mixer output signal ($mx_2$) based on the second scaled signal and the second local oscillator signal ($LO_2$). The $(N-1)^{th}$ mixer unit 106 may receive the $(N-1)^{th}$ scaled signal from the $(N-1)^{th}$ scaling unit 112 and receive the $(N-1)^{th}$ local oscillator signal ($LO_{N-1}$) having approximately $(N-1)/N$ duty cycle. The $(N-1)^{th}$ mixer unit 106 may generate the $(N-1)^{th}$ mixer output signal ($mx_{N-1}$) based on the $(N-1)^{th}$ scaled signal and the $(N-1)^{th}$ local oscillator signal ($LO_{N-1}$). The first local oscillator signal ($LO_1$), the second local oscillator signal ($LO_2$), and the $(N-1)^{th}$ local oscillator signal ($LO_{N-1}$) may have substantially the same frequency. For example, if N is 4 (i.e., the device 100 has 3 mixer units), the first local oscillator signal ($LO_1$) may have ¼ (i.e., 25%) duty cycle, the second local oscillator signal ($LO_2$) may have ½ (i.e., 50%) duty cycle, and the third (i.e., N−1) local oscillator signal may have ¾ (i.e., 75%) duty cycle.

The modulated output signal on the output line 116 may be generated based on the first mixer output signal ($mx_1$), the second mixer output signal ($mx_2$), and additional output signals including the $(N-1)^{th}$ mixer output signal ($mx_{N-1}$). For example, if N is 3 (i.e., the device 100 has 2 mixer units), the modulated output signal on the output line 116 is generated based on the first mixer output signal ($mx_1$) and the second mixer output signal ($mx_2$). If N is greater than 3, the modulated output signal on the output line 116 is generated based on the first mixer output signal ($mx_1$), the second mixer output signal ($mx_2$), and the $(N-1)^{th}$ mixer output signal ($mx_{N-1}$). For example, if N is 4 (i.e., the device 100 has 3 mixer units), the modulated output signal is generated based on the first mixer output signal ($mx_1$), the second mixer output signal ($mx_2$), and the third mixer output signal ($mx_3$) (i.e., $mx_{N-1}$ when N is 4). As another example, if N is 5 (i.e., the device 100 has 4 mixer units), the modulated output signal is generated based on the first mixer output signal ($mx_1$), the second mixer output signal ($mx_2$), a third mixer output signal ($mx_3$) (i.e., $mx_{N-2}$), and a fourth mixer output signal ($mx_4$) (i.e., $mx_{N-1}$ when N is 5).

The modulated output signal on the output line 116 may include signal components that correspond to the first harmonic frequency of the local oscillator signals $LO_1$, $LO_2$, . . . , $LO_{N-1}$. The modulated output signal may also include signal components that correspond to harmonic frequencies of the local oscillator signals $LO_1, LO_2, \ldots, LO_{N-1}$ that are equal to or higher than the $(2N-1)^{th}$ harmonic frequency of the local oscillator signals $LO_1, LO_2, \ldots, LO_{N-1}$. Signal components of the modulated output signal corresponding to harmonic frequencies of the local oscillator signals $LO_1, LO_2, \ldots, LO_{N-1}$ that are higher than the first harmonic frequency of the local oscillator signals $LO_1$, $LO_2, \ldots, LO_{N-1}$ and lower than the $(2N-1)^{th}$ harmonic frequency of the local oscillator signals $LO_1, LO_2, \ldots, LO_{N-1}$ are substantially suppressed.

By generating the modulated output signal that has some substantially suppressed signal components, undesirable effects of a non-linear amplifier (e.g., a non-linear power amplifier (not shown) of a transmitter that receives the modulated output signal on the output line 116 at its input) that may generate an output signal (e.g., an RF signal) based on the modulated output signal are reduced. For example, intermodulation between signal components of the modulated output signal may be reduced. Reducing intermodulation between signal components of the modulated output signal may reduce adjacent channel leakage-power ratio (ACLR) and the error vector magnitude (EVM) of a signal transmitter.

As described, although FIG. 1 shows three mixer units and three scaling units, in alternative embodiments, the device may include more than three mixer units or fewer than three mixer units and more than three scaling units or fewer than three scaling units. For example, when N is 5, the device 100 includes four mixer units and four scaling units. Further, although FIG. 1 shows the node 120 as a single point, the node 120 represents an electrical connection corresponding to one or more physical connection points.

Figure 2:
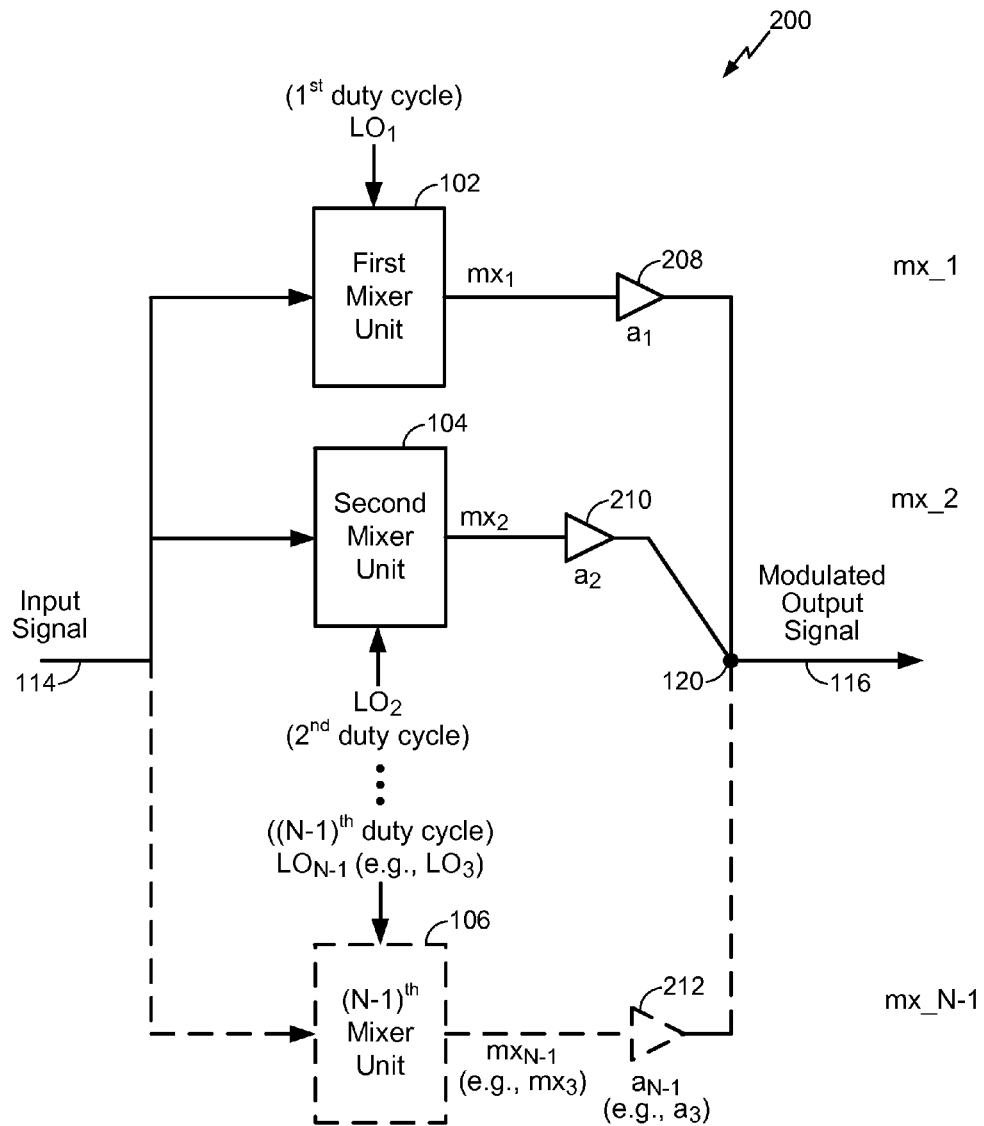
FIG. 2 is a block diagram of another particular embodiment of a device operable to perform signal component rejection.

Referring to FIG. 2, a particular embodiment of a device operable to perform signal component rejection is depicted and generally designated 200. The device 200 includes the first mixer unit 102 and the second mixer unit 104. The device 200 may also include additional mixer units including the $(N-1)^{th}$ mixer unit 106, where N is an integer greater than 3, and N-1 is a number of mixer units in the device 200. For example, when N is 4, the device 200 includes the first mixer unit 102, the second mixer unit, 104, and the third (i.e., $(N-1)^{th}$) mixer unit 106. As another example, when N is 6, the device 200 includes the first mixer unit 102, the second mixer unit 104, a third mixer unit, a fourth mixer unit, and the fifth (i.e., $(N-1)^{th}$) mixer unit 106. The device 200 may include the first scaling unit 208 and the second scaling unit 210. The device 200 may also include additional scaling units including the $(N-1)^{th}$ scaling unit 212. For example, when N is 4, the device 200 includes the first scaling unit 208, the second scaling unit 210, and the third (i.e., N-1) scaling unit 212. As another example, when N is 6, the device 200 includes the first scaling unit 208, the second scaling unit 210, a third scaling unit, a fourth scaling unit, and the fifth (i.e., N-1) scaling unit 212. The input signal on the input line 114 may be provided to the first mixer unit 102, to the second mixer unit 104, to the $(N-1)^{th}$ mixer unit 106, and to other mixer units that may be included in the device 200. For example, when N is 4, the input signal on the input line 114 may be provided to the first mixer unit 102, to the second mixer unit 104, and to the third (i.e., $(N-1)^{th}$) mixer unit 106. As another example, when N is 6, the input signal on the input line 114 may be provided to the first mixer unit 102, to the second mixer unit 104, to the third mixer unit, to the fourth mixer unit, and to the fifth (i.e., $(N-1)^{th}$) mixer unit 106.

In a particular embodiment, the first mixer unit 102 may be coupled to the first scaling unit 208. The second mixer unit 104 may be coupled to second scaling unit 210. The $(N-1)^{th}$ mixer unit 106 may be coupled to the $(N-1)^{th}$ scaling unit 212.

In a particular embodiment, the first mixer unit 102 may be configured to receive the input signal and the first local oscillator signal ($LO_1$) that has the first duty cycle. The first duty cycle may be approximately 1/N, where the device 200 includes N-1 mixer units that are each coupled to a corresponding scaling unit and where each corresponding scaling unit is coupled to the node 120. The first mixer unit 102 may be configured to generate the first mixer output signal ($mx_1$) based on the input signal and the first local oscillator signal ($LO_1$). The first mixer unit 102 may provide the first mixer output signal ($mx_1$) to the first scaling unit 208.

In a particular embodiment, the second mixer unit 104 may be configured to receive the input signal and the second local oscillator signal ($LO_2$) that has the second duty cycle. The second duty cycle may be approximately 2/N. The frequency of the second local oscillator signal ($LO_2$) may approximately equal the frequency of the first local oscillator signal ($LO_1$). The second mixer unit 104 may be configured to generate the second mixer output signal ($mx_2$) based on the input signal and the second local oscillator signal ($LO_2$). The second mixer unit 104 may provide the second mixer output signal ($mx_2$) to the second scaling unit 210.

In a particular embodiment, the $(N-1)^{th}$ mixer unit 106 may be configured to receive the input signal and the $(N-1)^{th}$ local oscillator signal ($LO_{N-1}$) that has an $(N-1)^{th}$ duty cycle. The $(N-1)^{th}$ local oscillator signal ($LO_{N-1}$) may have substantially the same frequency as the first local oscillator signal ($LO_1$) and the second local oscillator signal ($LO_2$). The $(N-1)^{th}$ mixer unit 106 may be configured to generate an $(N-1)^{th}$ mixer output signal ($mx_{N-1}$) based on the input signal and the $(N-1)^{th}$ local oscillator signal ($LO_{N-1}$). The $(N-1)^{th}$ mixer unit 106 may provide the $(N-1)^{th}$ mixer output signal ($mx_{N-1}$) to the $(N-1)^{th}$ scaling unit 212.

In a particular embodiment, the first scaling unit 208 is configured to generate a first scaled output signal by scaling the first mixer output signal ($mx_1$) by the first gain factor ($a_1$). The second scaling unit 210 is configured to generate a second scaled output signal by scaling the second mixer output signal ($mx_2$) by the second gain factor ($a_2$). The $(N-1)^{th}$ scaling unit 212 is configured to generate an $(N-1)^{th}$ scaled output signal by scaling the $(N-1)^{th}$ mixer output signal ($mx_{N-1}$) by the $(N-1)^{th}$ gain factor ($a_{N-1}$).

In a particular embodiment, an output of the first scaling unit 208, an output of the second scaling unit 210, and an output of the $(N-1)^{th}$ scaling unit 212 are coupled to the node 120. The modulated output signal on the output line 116 may be generated by combining, at the node 120, the first scaled output signal from the first scaling unit 208, the second scaled output signal from the second scaling unit 210, and the $(N-1)^{th}$ scaled output signal from the $(N-1)^{th}$ scaling unit 212.

The modulated output signal on the output line 116 may be represented by Equation (4) and Equation (5) as described with respect to FIG. 1. The first gain factor ($a_1$), the second gain factor ($a_2$), and the $(N-1)^{th}$ gain factor ($a_{N-1}$) may be determined based on Equation (6).

During operation, the input signal on the input line 114 may be provided to the first mixer unit 102, to the second mixer unit 104, and to the $(N-1)^{th}$ mixer unit 106. The first mixer unit 102 may receive the input signal and the first local oscillator signal ($LO_1$) having approximately 1/N duty cycle. The first mixer unit 102 may generate the first mixer output signal ($mx_1$) based on the input signal and the first local oscillator signal ($LO_1$). The second mixer unit 104 may receive the input signal and the second local oscillator signal ($LO_2$) having approximately 2/N duty cycle. The second mixer unit 104 may generate the second mixer output signal ($mx_2$) based on the input signal and the second local oscillator signal ($LO_2$). The $(N-1)^{th}$ mixer unit 106 may receive the input signal and the $(N-1)^{th}$ local oscillator signal ($LO_{N-1}$) having approximately (N-1)/N duty cycle. The $(N-1)^{th}$ mixer unit 106 may generate the $(N-1)^{th}$ mixer output signal ($mx_{N-1}$) based on the input signal and the $(N-1)^{th}$ local oscillator signal ($LO_{N-1}$).

The first scaling unit 208 may scale the first mixer output signal ($mx_1$) by the first gain factor ($a_1$) and generate the first scaled output signal. The second scaling unit 210 may scale the second mixer output signal ($mx_2$) by the second gain factor ($a_2$) and generate the second scaled output signal. The $(N-1)^{th}$ scaling unit 212 may scale the $(N-1)^{th}$ mixer output signal ($mx_{N-1}$) by the $(N-1)^{th}$ gain factor ($a_{N-1}$) and generate the $(N-1)^{th}$ scaled output signal.

For example, if N is 4 (i.e., the device 200 includes 3 mixer units), the $(N-1)^{th}$ scaling unit 212 is a third scaling unit, the $(N-1)^{th}$ gain factor ($a_{N-1}$) is a third gain factor ($a_3$), the $(N-1)^{th}$ mixer unit 106 is a third mixer unit, and the $(N-1)^{th}$ mixer output signal ($mx_{N-1}$) is a third mixer output signal ($mx_3$). Accordingly, the third scaling unit 212 may scale the third mixer output signal ($mx_3$) by the third gain factor ($a_3$) and generate a third scaled output signal.

The first scaled output signal, the second scaled output signal, and the $(N-1)^{th}$ scaled output signal may be combined at the node 120 to generate the modulated output signal on the output line 116. For example, if N is 4, the modulated output signal is generated by combining the first scaled output signal, the second scaled output signal, and the third scaled output signal. As another example, if N is 5 (i.e., the device 200 has 4 mixer units), the modulated output signal is generated by combining the first scaled output signal, the second scaled output signal, a third scaled output signal, and a fourth (i.e., N−1) scaled output signal.

The modulated output signal on the output line 116 may include signal components that are based on the first harmonic frequency of the local oscillator signals $LO_1$, $LO_2$, . . . , $LO_{N-1}$. The modulated output signal may also include signal components based on the harmonic frequencies of the local oscillator signals $LO_1$, $LO_2$, . . . , $LO_{N-1}$, where the harmonic frequencies are equal to or higher than the $(2N-1)^{th}$ harmonic frequency of the local oscillator signals $LO_1$, $LO_2$, . . . , $LO_{N-1}$. Signal components of the local oscillator signals $LO_1$, $LO_2$, . . . , $LO_{N-1}$ corresponding to the harmonic frequencies of the local oscillator signals $LO_1$, $LO_2$, . . . , $LO_{N-1}$ that are higher than the first harmonic frequency of the local oscillator signals $LO_1$, $LO_2$, . . . , $LO_{N-1}$ and lower than the $(2N-1)^{th}$ harmonic frequency of the local oscillator signals $LO_1$, $LO_2$, . . . , $LO_{N-1}$ are substantially suppressed (i.e., rejected) and do not substantially contribute to the modulated output signal.

The modulated output signal on the output line 116 may include signal components that correspond to the first harmonic frequency of the local oscillator signals $LO_1$, $LO_2$, . . . , $LO_{N-1}$. The modulated output signal may also include signal components that correspond to harmonic frequencies of the local oscillator signals $LO_1$, $LO_2$, . . . , $LO_{N-1}$ that are equal to or higher than the $(2N-1)^{th}$ harmonic frequency of the local oscillator signals $LO_1$, $LO_2$, . . . , $LO_{N-1}$. Signal components of the modulated output signal corresponding to harmonic frequencies of the local oscillator signals $LO_1$, $LO_2$, . . . , $LO_{N-1}$ that are higher than the first harmonic frequency of the local oscillator signals $LO_1$, $LO_2$, . . . , $LO_{N-1}$ and lower than the $(2N-1)^{th}$ harmonic frequency of the local oscillator signals $LO_1$, $LO_2$, . . . , $LO_{N-1}$ are substantially suppressed.

By generating the modulated output signal that has some substantially suppressed signal components, undesirable effects of a non-linear amplifier (e.g., a non-linear power amplifier of a transmitter) that may generate an output signal (e.g., an RF signal) based on the modulated output signal are reduced. For example, substantially suppressing signal components of the modulated output signal substantially suppresses spectral energies. For example, intermodulation between signal components of the modulated output signal may be reduced because spectral energies of the substantially suppressed signal components of the modulated output signal may be too low for the substantially suppressed signal components to effectively intermodulate to cause in-band interference and/or generate certain harmonic signal components of the output signal of the non-linear amplifier. Reducing intermodulation between signal components of the modulated output signal may reduce adjacent channel leakage-power ratio (ACLR) and the error vector magnitude (EVM) of a signal transmitter. For example, the gain factors $a_1$, $a_2$, . . . $a_{N-1}$ and the duty cycles of the local oscillator signals $LO_1$, $LO_2$, . . . $LO_{N-1}$ may be selected such that the combination of the mixer output signals $mx_1$, $mx_2$, . . . $mx_{N-1}$ at the node 120 results in the output signal on the output line 116 having particular harmonic components suppressed/rejected. To illustrate, the local oscillator signals may be represented by Equation (1) and the mixer output signals may be represented by Equation (2). The modulated output signal on the output line 116 may be represented by Equation (4) and Equation (5). Notably, the output signal has a first harmonic component (e.g., $\cos(\omega t)$) and a $(2N-1)^{th}$ harmonic component (e.g., $\cos((2N-1)\omega t)$), but no harmonic components between the first and $(2N-1)^{th}$ harmonic component. Thus, the system of FIG. 1 may enable rejection of multiple higher order harmonic components without generating multiple LO signals having varying frequencies and without varying signal delays. Rejection of higher order harmonic components may reduce in-band distortion that causes degradation in ACLR and EVM, and may thus improve signal quality and performance at an electronic device.

In a particular embodiment, systems and methods described herein (e.g., including the system of FIG. 1) may be used in conjunction with a chip, integrated circuit, or other electronic device that operates at 60 gigahertz (GHz) (e.g., utilizes a 60 GHz LO frequency). In high-frequency environments, such as 60 GHz environments, generation of reliable high-frequency signals may be difficult. It will be appreciated that when applied to a 60 GHz device, previous systems and methods of addressing in-band distortion would involve generation of signals having frequencies in the hundreds of gigahertz, which may be difficult to achieve. In contrast, the systems and methods described herein utilize LO signals having the same frequency and differing duty cycles, which may be more easily achieved. The described techniques may thus be especially applicable in high-frequency (e.g., 60 GHz) environments.

Although FIG. 2 shows three mixer units and three scaling units, in alternative embodiments, the device may include more or few than three mixer units and more or few than three scaling units. For example, when N is 5, the device 200 includes four mixer units and four scaling units. Further, in alternative embodiments, the input signal on the input line 114 may be a quadrature input signal that includes an in-phase signal and a quadrature-signal. Each of the local oscillator signals $LO_1$, $LO_2$, . . . , $LO_{N-1}$ may also be a quadrature signal. Each of the mixer units 102, 104, and 106 may be configured to receive a quadrature local oscillator signal and a scaled version of the quadrature input signal. Further, the input signal and/or each of the local oscillator signals $LO_1$, $LO_2$, . . . , $LO_{N-1}$ may be a differential signal. Additionally, although FIG. 2 shows the node 120 as a single point, the node 120 represents an electrical connection that may correspond to one or more physical connection points.

It should be noted that whereas FIG. 1 illustrated a 1/N duty cycle progression (e.g., $LO_1$=1/N, $LO_2$=2/N, etc.), FIG. 2 illustrates a more generalized duty cycle progression (e.g., first duty cycle, second duty cycle, etc.). Various sets of duty cycles (e.g., in which at least one duty cycle is greater than fifty percent) may be used in conjunction with the described techniques. For example, in a particular illustrative embodiment, a seed value (e.g., s) may be used to determine the duty cycles (e.g., $F_1(s)$, $F_2(s)$, etc., where F is a function of s). In other embodiments, other rules may govern the relationship between duty cycles.

Figure 3:
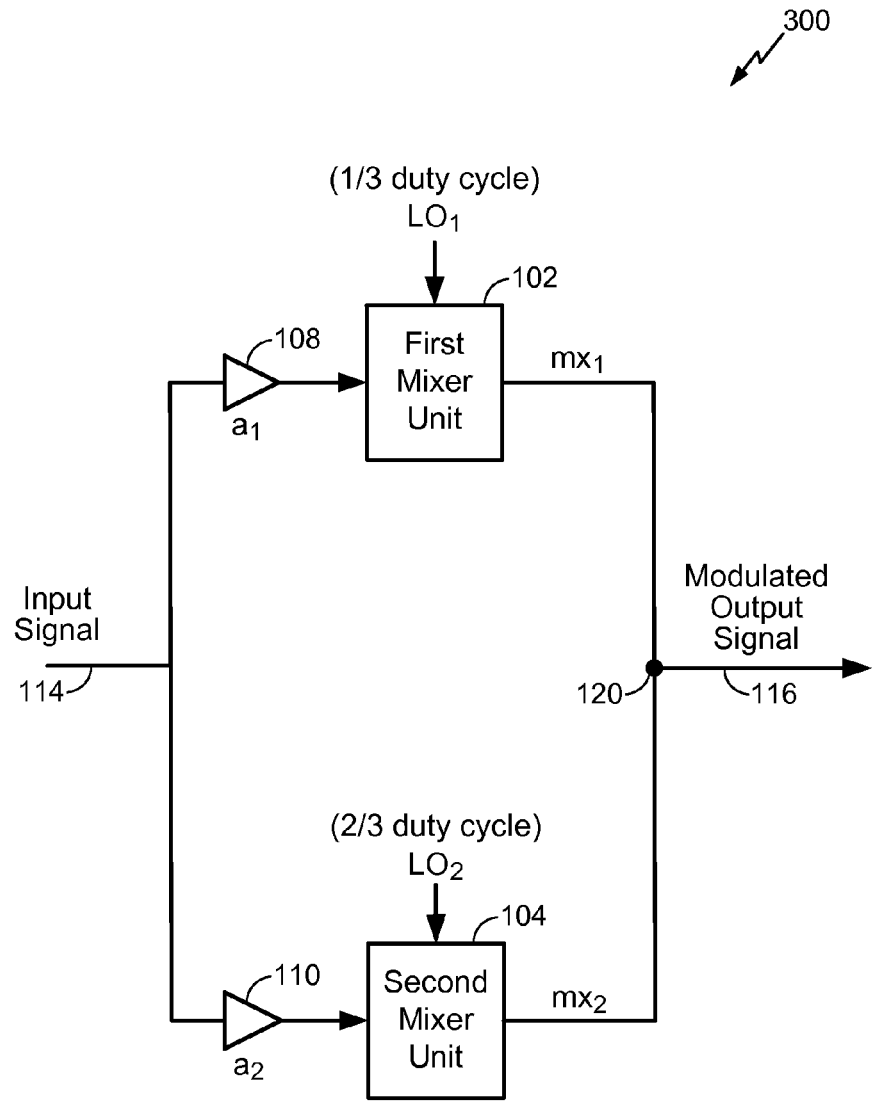
FIG. 3 is a diagram of a particular illustrative embodiment of the device of FIG. 1.

Referring to FIG. 3, a particular illustrative embodiment of the device 100 of FIG. 1 is depicted and generally designated 300. The device 300 corresponds to the device 100 of FIG. 1 when N is 3, where N−1 is the number of mixer units in the device 100. The device 300 may include the first mixer unit 102 and the second mixer unit 104. The device 300 may also include the first scaling unit 108 and the second scaling unit 110. The input signal on the input line 114 may be provided to the first scaling unit 108 and to the second scaling unit 110. The first scaling unit 108 may be coupled the first mixer unit 102, and the second scaling unit 110 may be coupled to the second mixer unit 104. In a particular embodiment, the input signal may be a baseband signal.

In a particular embodiment, the first scaling unit 108 may be configured to receive the input signal and to generate the first scaled signal. The first scaling unit 108 may generate the first scaled signal by scaling the input signal by a first gain factor ($a_1$). For example, the first scaling unit 108 may be an amplifier. The first scaling unit 108 may provide first scaled signal to the first mixer unit 102.

In a particular embodiment, the second scaling unit 110 may be configured to receive the input signal and to generate a second scaled signal. The second scaling unit 110 may generate the second scaled signal by scaling the input signal by a second gain factor ($a_2$). For example, the second scaling unit 110 may be an amplifier. The second scaling unit 110 may provide the second scaled signal to the second mixer unit 104.

In a particular embodiment, the first mixer unit 102 may be configured to receive the first scaled signal from the first scaling unit 108. The first mixer unit 102 may also be configured to receive a first local oscillator signal ($LO_1$) that has the first duty cycle. The first mixer unit 102 may be configured to generate a first mixer output signal ($mx_1$) based on the input signal and the first local oscillator signal ($LO_1$).

In a particular embodiment, the second mixer unit 104 may be configured to receive the second scaled signal from the second scaling unit 110. The second mixer unit 104 may also be configured to receive a second local oscillator signal ($LO_2$) that has a second duty cycle. The second mixer unit 104 may be configured to generate a second mixer output signal ($mx_2$) based on the second scaled signal and the second local oscillator signal ($LO_2$). In a particular embodiment, the second local oscillator signal ($LO_2$) is generated by phase shifting an inverted signal. The inverted signal may be generated by inverting the first local oscillator signal ($LO_1$).

In a particular embodiment, the frequency of the second local oscillator signal ($LO_2$) may approximately equal the frequency of the first local oscillator signal ($LO_1$). At least one of the first duty cycle and the second duty cycle may be greater than 50 percent (i.e., greater than ½). To illustrate, the first duty cycle may be approximately 1/N and the second duty cycle may be approximately 2/N. Because the device 300 has two mixer units (i.e., N−1 is 2), the first duty cycle is approximately ⅓ (e.g., approximately 33.3%) and the second duty cycle is approximately ⅔ (e.g., approximately 66.7%).

In a particular embodiment, the first mixer output signal ($mx_1$) and the second mixer output signal ($mx_2$) may be combined at the node 120 to generate the modulated output signal on the output line 116. The combination of the first mixer output signal ($mx_1$) and the second mixer output signal ($mx_2$) may result in the modulated output signal having substantially suppressed signal components corresponding to particular harmonic signal components of the local oscillator signals $LO_1$ and $LO_2$.

In a particular embodiment, each of the input signal on the input line 114, the first local oscillator signal ($LO_1$), the second local oscillator signal ($LO_2$), the first mixer output signal ($mx_1$), and the second mixer output signal ($mx_2$) includes a differential in-phase component and a differential quadrature component.

In a particular embodiment, the modulated output signal on the output line 116 may be represented by Equation (4) and Equation (5) as described with respect to FIG. 1. The first gain factor ($a_1$) and the second gain factor ($a_2$) may be determined based on Equation (6).

In a particular embodiment, the first gain factor ($a_1$) and the second gain factor ($a_2$) are selected such that signal components of the modulated output signal corresponding to particular harmonic frequencies of the first local oscillator signal and to particular harmonic frequencies of the second local oscillator signal are substantially suppressed. For example, the particular harmonic frequencies of the first local oscillator signal higher than the fundamental harmonic frequency of the first local oscillator signal and lower than the $(2N-1)^{th}$ harmonic frequency of the first local oscillator signal are substantially suppressed. The particular harmonic frequencies of the second local oscillator signal higher than the fundamental harmonic frequency of the second local oscillator signal and lower than the $(2N-1)^{th}$ harmonic frequency of the second local oscillator signal may be substantially suppressed. Because the device 300 has two mixer units (i.e., N is 3) configured to generate output signals that are combined to generate the modulated output signal, the particular harmonic frequencies of the first local oscillator signal that are higher than the fundamental harmonic frequency and lower than the fifth harmonic frequency are substantially suppressed. Similarly, the particular harmonic frequencies of the second local oscillator signal that are higher than the fundamental harmonic frequency and lower than the fifth harmonic frequency are substantially suppressed. Because the device 300 has two mixer units (i.e., N is 3), the first gain factor ($a_1$) and the second gain factor ($a_2$) are 1 and 1, respectively. As described, the gain factors are normalized based on the first gain term, $\sin \pi/N$, in Equation (6).

During operation, the input signal on the input line 114 may be provided to the scaling unit 108 and to the second scaling unit 110. The first scaling unit 108 may scale the input signal by the first gain factor ($a_1$) and generate the first scaled signal. The first scaling unit 108 may provide the first scaled signal to the first mixer unit 102. The second scaling unit 110 may scale the input signal by the second gain factor ($a_2$) and generate the second scaled signal. The second scaling unit 110 may provide the second scaled signal to the second mixer unit 104.

The first mixer unit 102 may receive the first scaled signal from the first scaling unit 108 and receive the first local oscillator signal ($LO_1$) having approximately ⅓ duty cycle. The first mixer unit 102 may generate the first mixer output signal ($mx_1$) based on the first scaled signal and the first local oscillator signal ($LO_1$). The second mixer unit 104 may receive the second scaled signal from the second scaling unit 110 and receive the second local oscillator signal ($LO_2$) having approximately ⅔ duty cycle. The second mixer unit 104 may generate the second mixer output signal ($mx_2$) based on the second scaled signal and the second local oscillator signal ($LO_2$).

The modulated output signal on the output line 116 is generated based on the first mixer output signal ($mx_1$) and the second mixer output signal ($mx_2$). The modulated output signal on the output line 116 may include signal components that correspond to the first harmonic frequency of the local oscillator signals $LO_1$ and $LO_2$. The modulated output signal may also include signal components that correspond to harmonic frequencies of the local oscillator signals $LO_1$ and $LO_2$ that are equal to or higher than the fifth harmonic frequency of the local oscillator signals $LO_1$ and $LO_2$. Signal components of the modulated output signal corresponding to harmonic frequencies of the local oscillator signals $LO_1$ and $LO_2$ that are higher than the first harmonic frequency of the local oscillator signals $LO_1$ and $LO_2$ and lower than the fifth harmonic frequency of the local oscillator signals $LO_1$ and $LO_2$ are substantially suppressed.

By generating the modulated output signal that has some substantially suppressed signal components, undesirable effects of a non-linear amplifier (e.g., a non-linear power amplifier of a transmitter) that may generate an output signal (e.g., an RF signal) based on the modulated output signal are reduced. For example, intermodulation between signal components of the modulated output signal may be reduced. Reducing intermodulation between signal components of the modulated output signal may reduce adjacent channel leakage-power ratio (ACLR) and the error vector magnitude (EVM) of a signal transmitter.

Although FIG. 3 shows the node 120 as a single point, the node 120 represents an electrical connection corresponding to one or more physical connection points. Further, although FIG. 3 shows outputs of the scaling units 108, 110 are coupled to the mixer units 102, 104, in alternative embodiments, the outputs of the mixer units 102, 104 may be coupled to inputs of the scaling units 108, 110, such as shown in FIG. 2.

Figure 4:
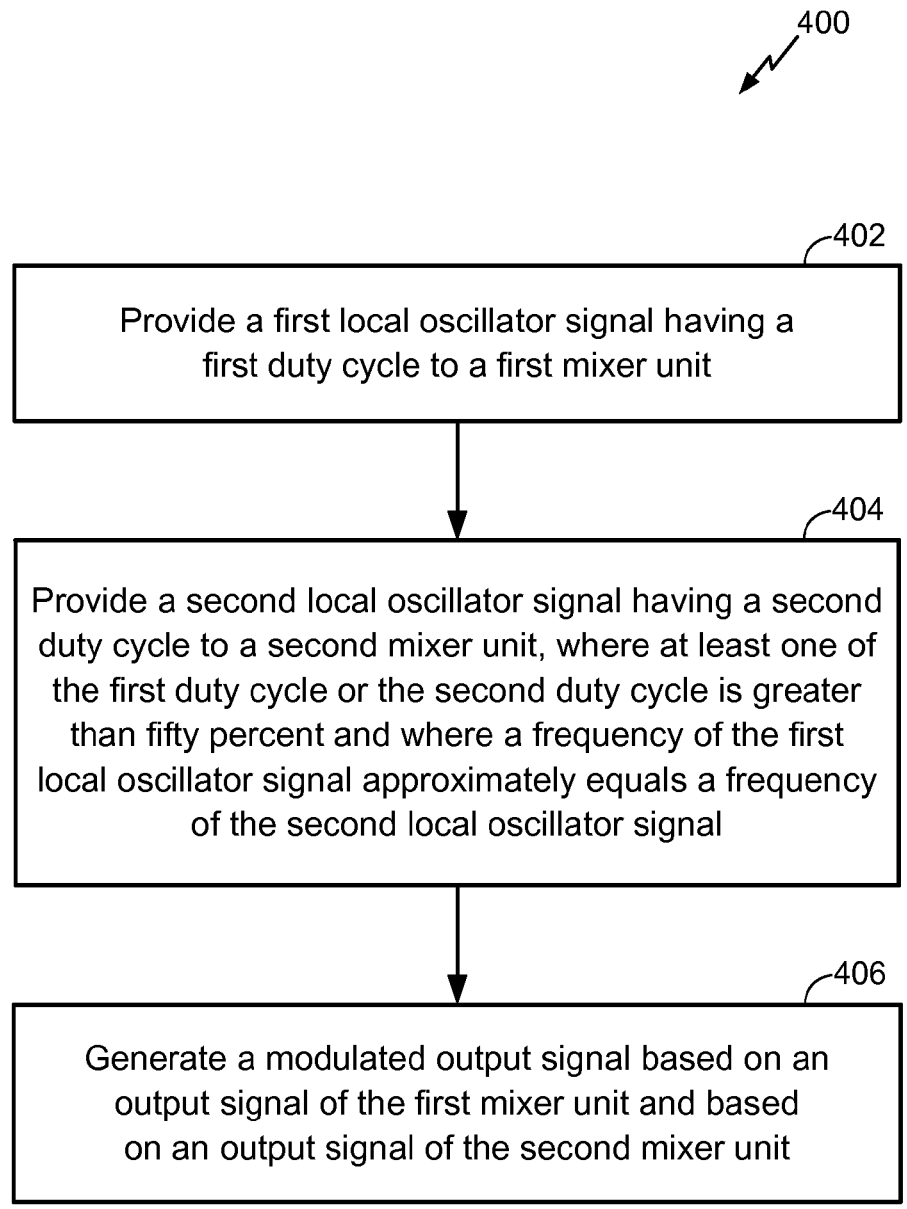
FIG. 4 is a flow chart of a particular illustrative embodiment of a method of operating the device of FIG. 1.

Referring to FIG. 4, a particular illustrative embodiment of a method of performing signal component rejection, such as by operation of the device 100 of FIG. 1, the device 200 of FIG. 2, and the device 300 of FIG. 3, is depicted and generally designated 400. The method 400 includes providing a first local oscillator signal having a first duty cycle to a first mixer unit, at 402. For example, the first local oscillator signal ($LO_1$) of FIGS. 1-3 having approximately 1/N duty cycle may be provided to the first mixer unit 102 of FIGS. 1-3. The method 400 also includes providing a second local oscillator signal having a second duty cycle to a second mixer unit, at 404. For example, the second local oscillator signal $LO_2$ of FIGS. 1-3 having approximately 2/N duty cycle may be provided to the second mixer unit 104 of FIGS. 1-3. At least one of the first duty cycle or the second duty cycle is greater than fifty percent. For example, if N is 3, the second local oscillator signal ($LO_2$) has approximately ⅔ (i.e., approximately 66.6%) duty cycle. A frequency of the first local oscillator signal may approximately equal a frequency of the second local oscillator signal. For example, the frequency of the first local oscillator signal ($LO_1$) may approximately equal the frequency of the second local oscillator signal ($LO_2$).

The method 400 further includes generating a modulated output signal based on an output signal of the first mixer unit and based on an output signal of the second mixer unit, at 406. For example, the modulated output signal on the output line 116 of FIGS. 1-3 may be generated based on the first mixer output signal ($mx_1$) and based on the second mixer output signal ($mx_2$) of FIGS. 1-3.

The method 400 of FIG. 4 may be implemented by an application-specific integrated circuit (ASIC), a field-programmable gate array (FPGA) device, a processing unit such as a central processing unit (CPU), a digital signal processor (DSP), a controller, another hardware device, a firmware device, or any combination thereof. As an example, the method of FIG. 4 can be performed by or in response to signals or commands from a processor that executes instructions, as described with respect to FIG. 5.

Figure 5:
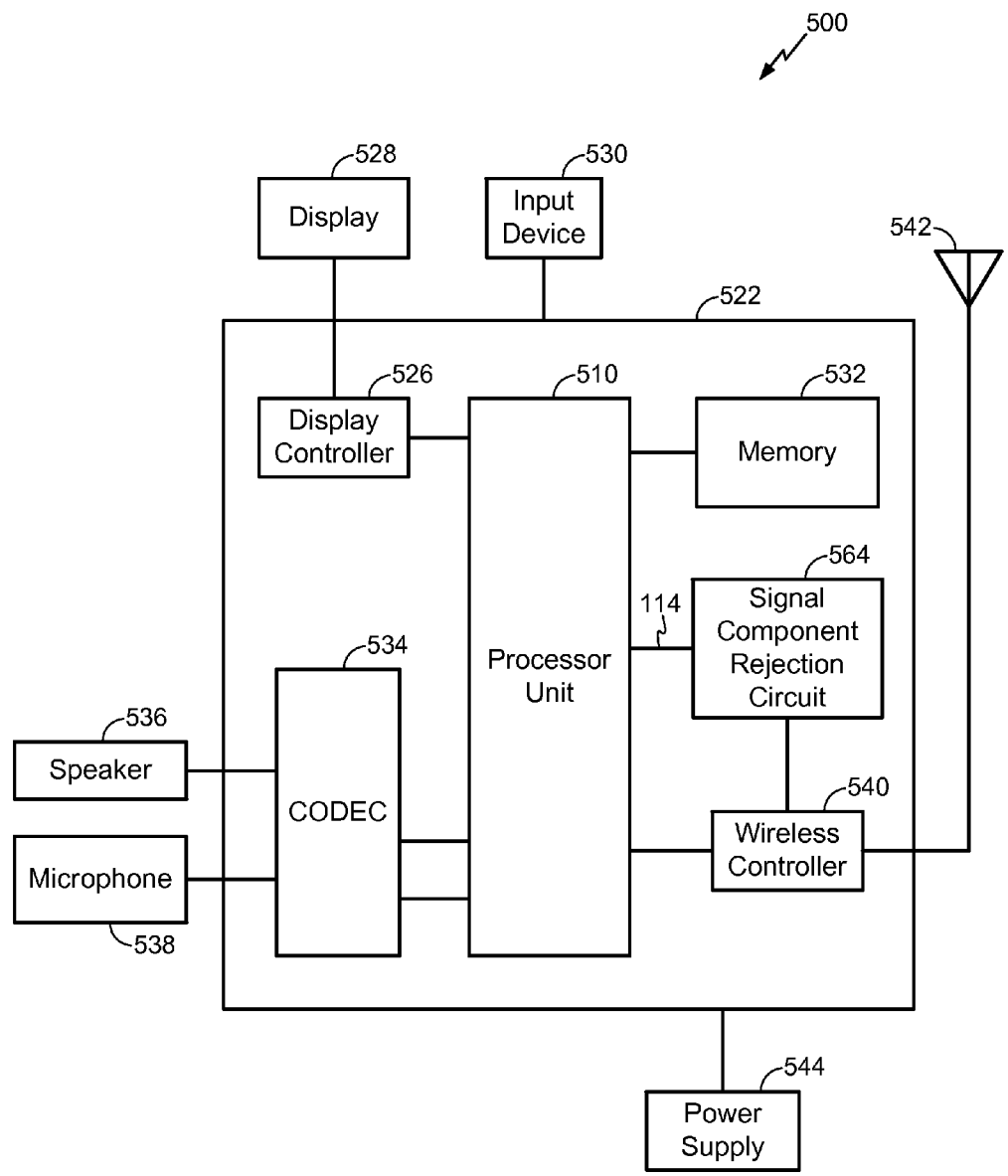
FIG. 5 is a block diagram of a wireless device including a signal component rejection circuit.

Referring to FIG. 5, a block diagram of a particular illustrative embodiment of a wireless communication device that includes a signal component rejection circuit is depicted and generally designated 500. The wireless communication device 500 includes a processor unit 510, such as a digital signal processor (DSP), coupled to a memory 532. The wireless communication device 500 may include a signal component rejection circuit 564. In an illustrative embodiment, the signal component rejection circuit 564 may correspond to the device 100 of FIG. 1, the device 200 of FIG. 2, the device 300 of FIG. 3, or may operate according to the method of FIG. 4, or any combination thereof.

The memory 532 may be a non-transitory computer readable medium storing program code that is executable by the processor unit 510 (e.g., a computer) to cause the processor unit 510 to provide an input signal via the input line 114 to the signal component rejection circuit 564. For example, the input signal (e.g., the input signal on the line 114 of FIGS. 1-3) may be a baseband signal that is provided to the signal component rejection circuit 564 to generate an output signal (e.g., the modulated output signal on the output line 116 of FIGS. 1-3). The output signal does not include signal components (or has suppressed signal components) that correspond to some harmonic frequencies of local oscillator signals provided to the signal component rejection circuit 564.

FIG. 5 also shows a display controller 526 that is coupled to the processor unit 510 and to a display 528. A coder/decoder (CODEC) 534 can also be coupled to the processor unit 510. A speaker 536 and a microphone 538 can be coupled to the CODEC 534.

FIG. 5 indicates that a wireless controller 540 can be coupled to the processor unit 510 and to a wireless antenna 542. In a particular embodiment, the processor unit 510, the signal component rejection circuit 564, the display controller 526, the memory 532, the CODEC 534, and the wireless controller 540 are included in a system-in-package or system-on-chip device 522. For example, the signal component rejection circuit 564 may provide an output signal (e.g., the modulated output signal on the output line 116 of FIGS. 1-3) to the wireless controller, such that the wireless controller 540 processes the signal for transmission via the wireless antenna 542. To illustrate, the wireless controller 540 may include an amplifier (e.g., a power amplifier) that receives the output signal (e.g., the modulated output signal on the output line 116 of FIGS. 1-3) from the signal component rejection circuit 564. The amplifier may amplify the output signal from the signal component rejection circuit 564 to generate an amplified output signal for transmission via the wireless antenna 542. The wireless controller 540 may also include a transceiver. In a particular embodiment, an input device 530 and a power supply 544 are coupled to the system-on-chip device 522. Moreover, in a particular embodiment, as illustrated in FIG. 5, the display 528, the input device 530, the speaker 536, the microphone 538, the wireless antenna 542, and the power supply 544 are external to the system-on-chip device 522. However, each of the display 528, the input device 530, the speaker 536, the microphone 538, the wireless antenna 542, and the power supply 544 can be coupled to a component of the system-on-chip device 522, such as an interface or a controller.

While FIG. 5 illustrates a particular embodiment of a wireless device 500, one or more circuits (e.g., the signal component rejection circuit 564) may be integrated in other electronic devices including a set top box, a music player, a video player, an entertainment unit, a navigation device, a communications device, a personal digital assistant (PDA), a fixed location data unit, and a computer.

In conjunction with the described embodiments, an apparatus is disclosed that may include first means for signal mixing, second means for signal mixing, and third means for signal mixing. For example, the first means for signal mixing may include the first mixer unit 102 of FIGS. 1-3. The second means for signal mixing may include the second mixer unit 104 of FIGS. 1-3. The third means for signal mixing may include the $(N-1)^{th}$ mixer unit 106 of FIGS. 1 and 2. The first means for signal mixing may be configured to receive a first local oscillator signal having a first duty cycle. For example, the first mixer unit 102 of FIGS. 1-3 may be configured to receive the first local oscillator signal ($LO_1$) of FIGS. 1-3 having approximately 1/N duty cycle. The second means for signal mixing may be configured to receive a second local oscillator signal having a second duty cycle. For example, the second mixer unit 104 of FIGS. 1-3 may be configured to receive the second local oscillator signal ($LO_2$) of FIGS. 1-3 having approximately 2/N duty cycle. The third means for signal mixing may be configured to receive a third local oscillator signal having a third duty cycle, where a modulated output signal is generated based on an output signal of the first means for signal mixing, an output signal of the second means for signal mixing, and an output signal of the third means for signal mixing. For example, the $(N-1)^{th}$ mixer unit 106 of FIGS. 1 and 2 may be configured to receive the $(N-1)^{th}$ local oscillator signal ($LO_{N-1}$) of FIGS. 1 and 2 having approximately (N-1)/N duty cycle.

The apparatus may further include first means for scaling configured to generate a first scaled input signal by scaling an input signal by a first gain factor. For example, the first means for scaling may include the first scaling unit 108 of FIGS. 1 and 3. The apparatus may also include second means for scaling configured to generate a second scaled input signal by scaling the input signal by a second gain factor. For example, the second means for scaling may include the second scaling unit 110 of FIGS. 1 and 3. The apparatus may further include third means for scaling configured to generate a third scaled signal by scaling the input signal by a third gain factor, where the first means for signal mixing is configured to receive the first scaled signal, where the second means for signal mixing is configured to receive the second scaled signal, and where the third means for signal mixing is configured to receive the third scaled signal. For example, the third means for scaling may include the $(N-1)^{th}$ scaling unit 112 of FIGS. 1 and 3.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of signal generation comprising:
generating, at a first mixer unit, a first mixer output signal based on a first local oscillator signal having a first duty cycle to a first mixer unit;
providing a first scaled input signal to the first mixer unit, wherein the first scaled input signal is generated by scaling an input signal by a first gain factor;
generating, at a second mixer unit, a second mixer output signal based on a second local oscillator signal having a second duty cycle to a second mixer unit;
providing a second scaled input signal to the second mixer unit, wherein the second scaled input signal is generated by scaling the input signal by a second gain factor;
providing a third local oscillator signal having a third duty cycle to a third mixer unit;
providing a third scaled input signal to the third mixer unit, wherein the third scaled input signal is generated by scaling the input signal by a third gain factor; and
generating a modulated output signal based on the first mixer output signal, the second mixer unit output signal, and a third mixer unit output signal.

2. The method of claim 1, wherein the first duty cycle is approximately 1/N, wherein the second duty cycle is approximately 2/N, wherein a number of mixer units configured to generate output signals that are combined to generate the modulated output signal is N-1, and wherein N is an integer greater than 2.

3. The method of claim 1, wherein at least one of the first duty cycle or the second duty cycle is greater than fifty percent and wherein a frequency of the first local oscillator signal approximately equals a frequency of the second local oscillator signal.

4. The method of claim 1, wherein signal components of the modulated output signal corresponding to harmonic signal components of the first local oscillator signal that are above a first harmonic signal component of the first local oscillator signal and below a fifth harmonic signal component of the first local oscillator signal are substantially suppressed.

5. The method of claim 1, wherein the second local oscillator signal is generated by phase shifting an inverted signal that is generated by inverting the first local oscillator signal.

6. The method of claim 1, wherein the first gain factor and the second gain factor are selected such that signal components of the modulated output signal corresponding to harmonic frequencies of the first local oscillator signal that are higher than a fundamental harmonic frequency of the first local oscillator signal and lower than a $(2N-1)^{th}$ harmonic frequency of the first local oscillator signal are substantially suppressed, wherein N is an integer greater than 2, and wherein N−1 is a number of mixer units configured to generate output signals that are combined to generate the modulated output signal.

7. The method of claim 1, wherein each of the input signal, the first local oscillator signal, the second local oscillator signal, the first mixer output signal, and the second mixer output signal includes a differential in-phase component and a differential quadrature component.

8. The method of claim 1, wherein the modulated output signal is generated by combining a first scaled output signal and a second scaled output signal, wherein the first scaled output signal is generated by scaling the first mixer output signal by a first output gain factor and wherein the second scaled output signal is generated by scaling the second mixer output signal by a second output gain factor.

9. A device comprising:
   a first mixer unit;
   a second mixer unit; and
   a third mixer unit,
   wherein the first mixer unit is configured to receive a first local oscillator signal having a first duty cycle,
   wherein the second mixer unit is configured to receive a second local oscillator signal having a second duty cycle,
   wherein the third mixer unit is configured to receive a third local oscillator signal having a third duty cycle,
   wherein a modulated output signal is generated based on a first output signal of the first mixer unit, a second output signal of the second mixer unit, and a third output signal of the third mixer unit,
   wherein the first duty cycle is approximately 1/N,
   wherein the second duty cycle is approximately 2/N,
   wherein the third duty cycle is approximately 3/N,
   wherein a number of mixer units that generate output signals that are combined to generate the modulated output signal is N−1, and
   wherein N is an integer greater than 3.

10. The device of claim 9, further comprising:
   a first scaling unit configured to generate a first scaled signal by scaling an input signal by a first gain factor;
   a second scaling unit configured to generate a second scaled signal by scaling the input signal by a second gain factor; and
   a third scaling unit configured to generate a third scaled signal by scaling the input signal by a third gain factor,
   wherein the first mixer unit is configured to receive the first scaled signal, wherein the second mixer unit is configured to receive the second scaled signal, and wherein the third mixer unit is configured to receive the third scaled signal.

11. The device of claim 9, wherein N equals 4.

12. The device of claim 10, wherein the first gain factor, the second gain factor, and the third gain factor are selected such that signal components of the modulated output signal corresponding to harmonic frequencies of the first local oscillator signal that are higher than a fundamental harmonic frequency of the first local oscillator signal and lower than a $(2N-1)^{th}$ harmonic frequency of the first local oscillator signal are substantially suppressed.

13. The device of claim 9, wherein the first mixer unit, the second mixer unit, and the third mixer unit are configured to receive an input signal.

14. The device of claim 13, further comprising:
   a first scaling unit configured to generate a first scaled signal by scaling the output signal of the first mixer unit by a first gain factor;
   a second scaling unit configured to generate a second scaled signal by scaling the output signal of the second mixer unit by a second gain factor; and
   a third scaling unit configured to generate a third scaled signal by scaling the output signal of the third mixer unit by a third gain factor.

15. The device of claim 14, wherein the modulated output signal is generated by combining the first scaled signal, the second scaled signal, and the third scaled signal.

16. The device of claim 9, wherein a plurality of signal components of the modulated output signal having frequencies higher than a third harmonic frequency of the first local oscillator signal are substantially suppressed.

17. The device of claim 9, wherein the first local oscillator signal has a frequency of approximately 60 gigahertz (GHz).

18. An apparatus comprising:
   first means for scaling;
   second means for scaling;
   third means for scaling;
   first means for signal mixing;
   second means for signal mixing; and
   third means for signal mixing,
   wherein the first means for scaling is configured to generate a first scaled signal by scaling an input signal by a first gain factor,
   wherein the second means for scaling is configured to generate a second scaled signal by scaling the input signal by a second gain factor,
   wherein the third means for scaling is configured to generate a third scaled signal by scaling the input signal by a third gain factor,
   wherein the first means for signal mixing is configured to:
      receive the first scaled signal, and
      receive a first local oscillator signal having a first duty cycle,
   wherein the second means for signal mixing is configured to:
      receive the second scaled signal, and
      receive a second local oscillator signal having a second duty cycle,
   wherein the third means for signal mixing is configured to:
      receive the third scaled signal, and
      receive a third local oscillator signal having a third duty cycle, and
   wherein a modulated output signal is generated based on a first output signal of the first means for signal mixing, a second output signal of the second means for signal mixing, and a third output signal of the third means for signal mixing.

19. The apparatus of claim 18, further comprising:
   first means for output scaling configured to generate a first scaled output signal by scaling the first output signal of the first means for signal mixing by a first output gain factor;
   second means for output scaling configured to generate a second scaled output signal by scaling the second output signal of the second means for signal mixing by a second output gain factor; and third means for output scaling configured to generate a third scaled output signal by scaling the third output signal of the third means for signal mixing by a third output gain factor.

20. The apparatus of claim 18, wherein the first means for signal mixing, the second means for signal mixing, and the third means for signal mixing are configured to receive an input signal.

21. The apparatus of claim 20, further comprising:
first means for scaling configured to generate a first scaled output signal by scaling the output signal of the first means for signal mixing by a first gain factor;
second means for scaling configured to generate a second scaled output signal by scaling the output signal of the second means for signal mixing by a second gain factor; and
third means for scaling configured to generate a third scaled output signal by scaling the output signal of the third means for signal mixing by a third gain factor.

22. The apparatus of claim 21, wherein the modulated output signal is generated by combining the first scaled output signal, the second scaled output signal, and the third scaled output signal.

\* \* \* \* \*